United States Patent [19]
Slade

[11] Patent Number: 5,969,527
[45] Date of Patent: Oct. 19, 1999

[54] RF COIL ASSEMBLY

[75] Inventor: Robert Andrew Slade, Oxen, United Kingdom

[73] Assignee: Oxford Instruments (UK) Limited, Eynsham, United Kingdom

[21] Appl. No.: 08/905,470

[22] Filed: Aug. 4, 1997

[30] Foreign Application Priority Data

Sep. 2, 1996 [GB] United Kingdom .................. 9618267

[51] Int. Cl.⁶ .................................................. G01V 3/00
[52] U.S. Cl. ......................................... 324/318; 324/303
[58] Field of Search .................................. 324/303, 312, 324/314, 318, 322

[56] References Cited

U.S. PATENT DOCUMENTS

| | | | |
|---|---|---|---|
| 2,451,596 | 10/1948 | Wheeler | 175/182 |
| 2,582,314 | 1/1952 | Doll | 324/303 |
| 5,065,099 | 11/1991 | Sinclair et al. | 324/339 |
| 5,438,267 | 8/1995 | Wu | 324/339 |
| 5,442,294 | 8/1995 | Rorden | 324/339 |
| 5,445,153 | 8/1995 | Sugie et al. | 324/322 |
| 5,680,044 | 10/1997 | McDougall et al. | 324/303 |

FOREIGN PATENT DOCUMENTS

| | | |
|---|---|---|
| 0434439 | 12/1990 | European Pat. Off. |
| 9102253 | 2/1991 | WIPO |
| 9411748 | 5/1994 | WIPO |

*Primary Examiner*—Louis Arana
*Attorney, Agent, or Firm*—Price Gess & Ubell

[57] ABSTRACT

An rf coil assembly for use in an NMR investigation, the assembly comprising (1) a transmitter coil (10) adapted to transmit an rf magnetic field suitable for the NMR investigation into a working region and comprising a plurality of serially connected winding elements (1–4); and (2) a receiver coil (9) electrically separate from the transmitter coil and adapted to receive an rf signal from the working region and comprising a plurality of serially connected winding elements (5–9).

Winding elements of one coil are interleaved and substantially coaxial with winding elements of the other coil, and at least one of the coils comprises one or more winding elements which are counter-wound with respect to the other winding element(s) in the coil.

17 Claims, 7 Drawing Sheets

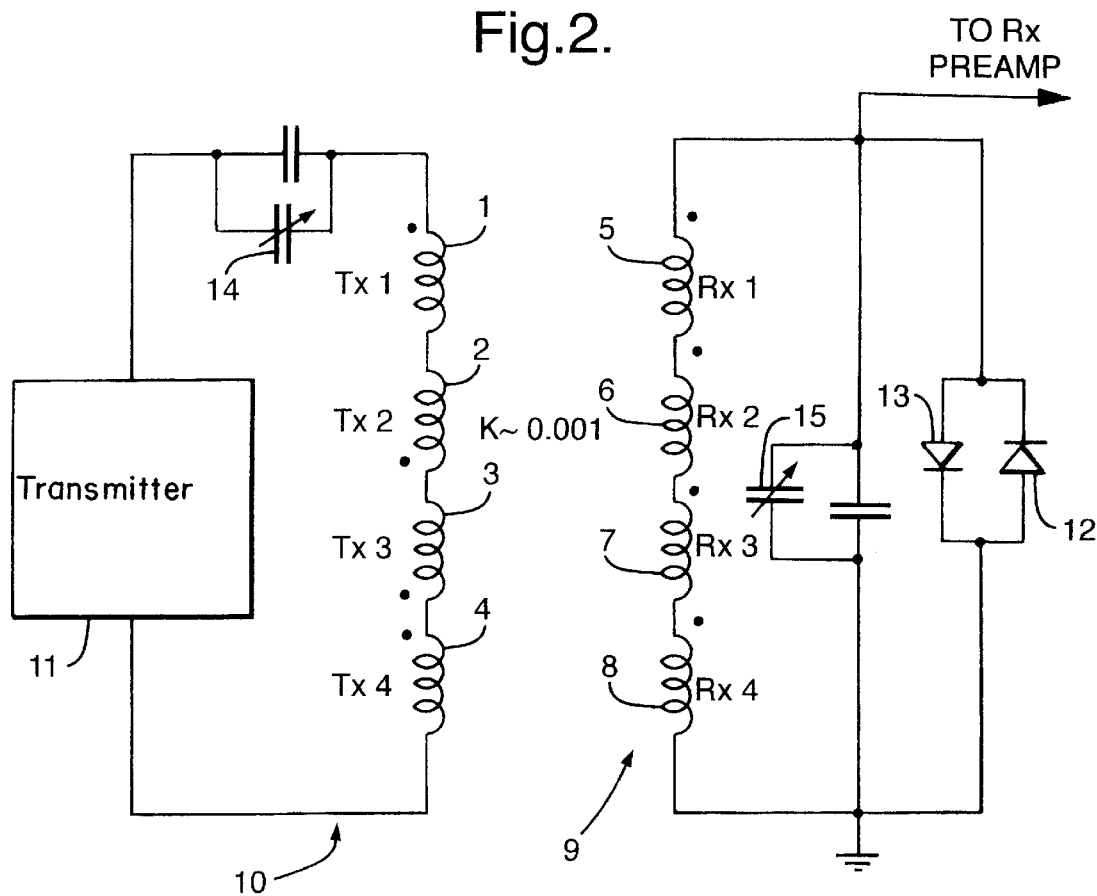

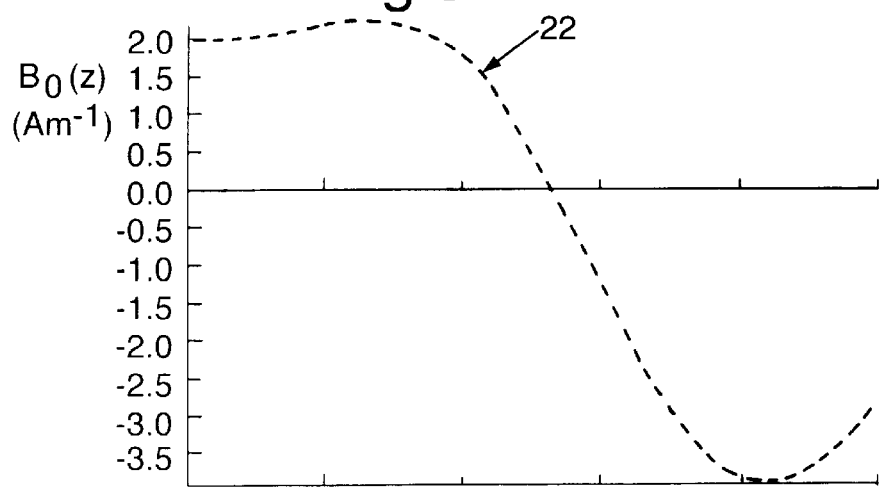
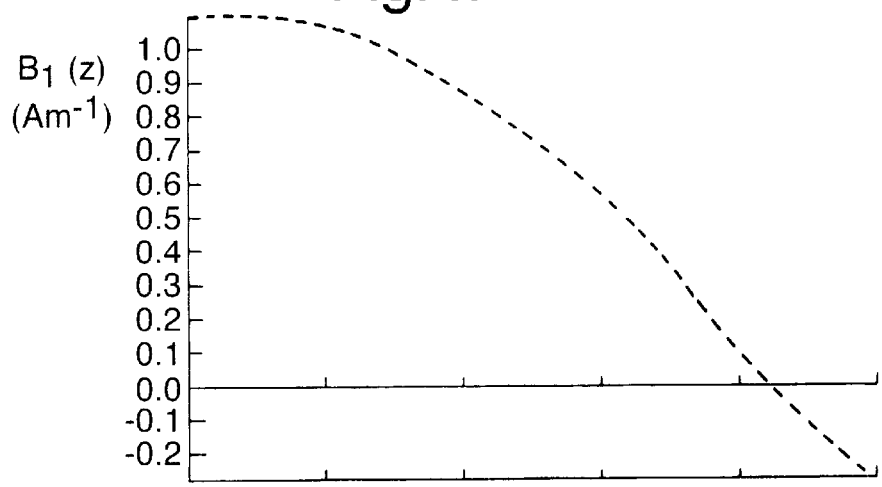

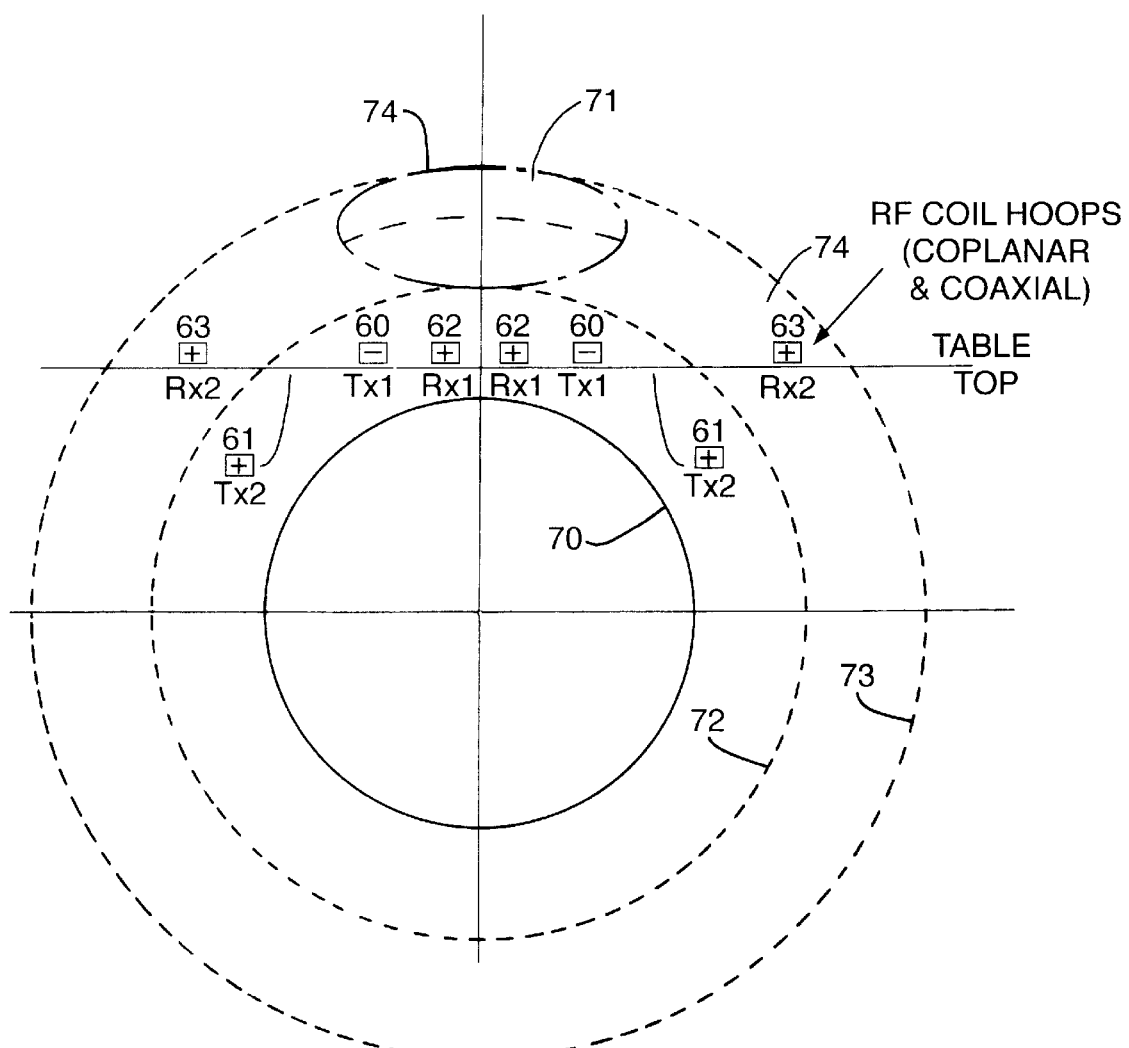

RF COIL ASSEMBLY

FIELD OF THE INVENTION

The present invention relates to an rf coil assembly for use in a Nuclear Magnetic Resonance (NMR) investigation.

DESCRIPTION OF THE PRIOR ART

In conventional NMR it is sometimes desired to use electrically separate transmitter (Tx) and receiver (Rx) rf coils (rather than a single coil performing both transmit and receive functions alternately) because separate coils can be optimised for their respective functions better than a single coil. To achieve low coupling between the coils, resulting in low feedthrough of the rf pulse, Tx and Rx coils are conventionally positioned physically at right angles to each other to produce orthogonal fields in the region of interest (otherwise known as the working region). An example of such an orthogonal rf coil arrangement is disclosed in U.S. Pat. No. 5,445,153.

However physically crossed coils are difficult to implement in the limited space envelope of an NMR well logging tool and have technical disadvantages (limited azimuthal field of view, lower efficiency, difficult to optimise field profiles).

SUMMARY OF THE INVENTION

In accordance with the present invention there is provided an rf coil assembly for use in an NMR investigation, the assembly comprising (1) a transmitter coil adapted to transmit an rf magnetic field suitable for the NMR investigation into a working region and comprising a plurality of serially connected winding elements; and (2) a receiver coil electrically separate from the transmitter coil and adapted to receive an rf signal from the working region and comprising a plurality of serially connected winding elements, wherein winding elements of one coil are interleaved and substantially coaxial with winding elements of the other coil, and wherein at least one of the coils comprises one or more winding elements which are counter-wound with respect to the other winding element(s) in the coil.

The arrangement of the present invention results in a coil system which produces rf fields suited to an axially optimised B0 magnet profile, but also has very low coupling between the transmitter (Tx) and receiver (Rx) coils despite their coaxial arrangement and close proximity. That is, the mutual inductance of the coils can be made very small. Preferably the coupling coefficient between the two coils is less than 0.01. Consequently very little energy is injected into the Rx coil during the high power Tx pulse. This reduces the time necessary to dissipate this energy, improves the NMR measurement dead time, and ensures that the Tx and Rx coils can be tuned independently.

The transmitter ($T_x$) and receiver ($R_x$) coils are electrically separate in the sense that there is no direct galvanic connection between them.

The two coils are interleaved in the sense that the one or more of the winding elements of one coil are sandwiched between winding elements of the other coil. Preferably however at least two of the winding elements of one coil are each sandwiched between a respective pair of winding elements of the other coil.

By interleaving the transmitter and receiver coil elements, suitably positioned, with counterwound sections, the Tx to Rx mutual inductance is minimised (due to the low flux linkage resulting) and the resulting RF pulse voltage feedthrough is no more than would be the case for a crossed coil set. At the same time, the coil element positions, and the resultant field profiles, optimise the NMR response of the tool. The invention therefore provides the advantages of a crossed coil system without the associated disadvantages in this application.

The coils may be arranged as two sets of substantially coaxial winding elements, with one set arranged at an angle to the other set. Preferably however all the winding elements are arranged substantially coaxially.

The winding elements need not be strictly coaxial, although flux must link from one winding element to another. The pair of counter-wound winding elements, suitably positioned, induce equal and opposite voltages across the other winding elements, resulting in reduced coupling. Without counter-wound elements, the flux from the transmitter coil links strongly with the receiver coil and the voltage induced on the receiver coil from the transmitter coil is large (which is the equivalent of strong coupling).

The counter-wound elements result in their associated coil being less gauss/amp efficient than it would be without the counter-wound elements, but, when used in the Tx coil, the counter-wound elements not only afford good Rx coil isolation but also make a crucial difference to the Tx coil field profile.

Preferably the winding elements each comprise one or more solenoidal turns, but "race-track" (ie: rectangular) or other profile turns are entirely feasible.

Preferably the transmitter and receiver coils both have magnetic field profiles in the same orientation in the working region.

In one embodiment the winding elements are not co-planar. In this case, one coil typically comprises at least four winding elements and the other coil comprises at least two winding elements. In a particular preferable embodiment, the assembly comprises four transmitter elements and four receiver elements. Typically the elements are arranged in two symmetrical sections, each having two interleaved receiver and transmitter elements one of which is counter-wound. The roles of transmitter coil and receiver coil are interchangeable, but preferably the coil containing the counter-wound elements is the transmitter coil. This is because the gauss-per-amp inefficiency created by the counter-wound transmitter coil elements can be compensated for by increasing transmitter power.

Preferably the assembly is used in combination with a B0 generating magnet assembly. That is, the magnet assembly generates a B0 magnetic field within the working region being suitable for obtaining NMR information from material in the working region. In one embodiment the B0 generating assembly generates an axially optimised B0 profile which exhibits a radial gradient which is substantially uniform in the axial direction. An example of such an assembly is described in copending British patent application GB9523415.9. The Tx coil generates a B1 rf magnetic field in the working region and the Rx coil senses the NMR response from the working region in order to perform the NMR investigation.

The NMR response takes the form of an echo when a spin-echo pulsed RF experiment is conducted. Alternatively, the Nuclear Magnetic Resonance effect may be observed by continuous wave NMR, where the effect is observed as an RF absorption maximum at the resonant frequency; "free induction decay" (FID) in a simple pulsed RF experiment, the "adiabatic fast passage" (AFP) method, etc.

In a further alternative, the winding elements of one coil may be substantially co-planar and concentric with winding elements of the other coil. In this case the winding elements may be circular, elliptical, or any other simple shape.

Typically the working region is outside the coils.

The invention would be useful for any NMR system with an external working region. However the coil assembly of the present invention is particularly suitable for NMR investigations utilising an axially optimised permanent magnet system (as described for example in copending British patent application GB9523415.9). That is, the coils are preferably arranged such that the working region is defined at a particular resonant Lamor frequency by a substantially radially oriented, static magnetic BO profile which is radially outwardly spaced from the coils and extends substantially parallel with an axis defined by the coils, wherein the field profiles associated with the transmitter and receiver coils are suitable for obtaining NMR information from material in the working region and which both exhibit substantially axially oriented, and substantially uniform rf magnetic field in the axial direction. The working region is defined by the BO static magnet field at the chosen resonant frequency; for the axially optimised system described in copending British patent application GB9523415.9, this is a cylindrical shaped shell around the assembly. The coil system is designed so that the RF magnetic field from the transmitter coil illuminates this region substantially uniformly, and that RF signal (normally in the form of a spin-echo) is picked up uniformly by the receiver coil, (as dictated by the Principle of Reciprocity). This allows a signal to be received from an entire 360° of the cylindrically shaped resonant shell (i.e. 100% azimuthal view).

The rf coil assembly may be used in any suitable NMR investigation but preferably the assembly comprises part of a down-hole well logging or measurement whilst drilling (MWD) tool.

BRIEF DESCRIPTION OF THE DRAWINGS

A number of embodiments of the present invention will now be described with reference to the accompanying drawings, in which:

FIG. 1b gives the coil positions of the coil arrangement of FIG. 1a;

FIG. 2 is a circuit diagram illustrating the transmitter and receiver tank circuit connections;

FIG. 3 is a graph illustrating the axial component of the transmitter coil magnetic field in the sensitive region at 150 mm radius;

FIG. 4 is a graph illustrating the axial component of the receiver coil magnetic field in the sensitive region at 150 mm radius;

FIG. 8 is a side view of a further alternative assembly.

EMBODIMENT

Figure 1A:
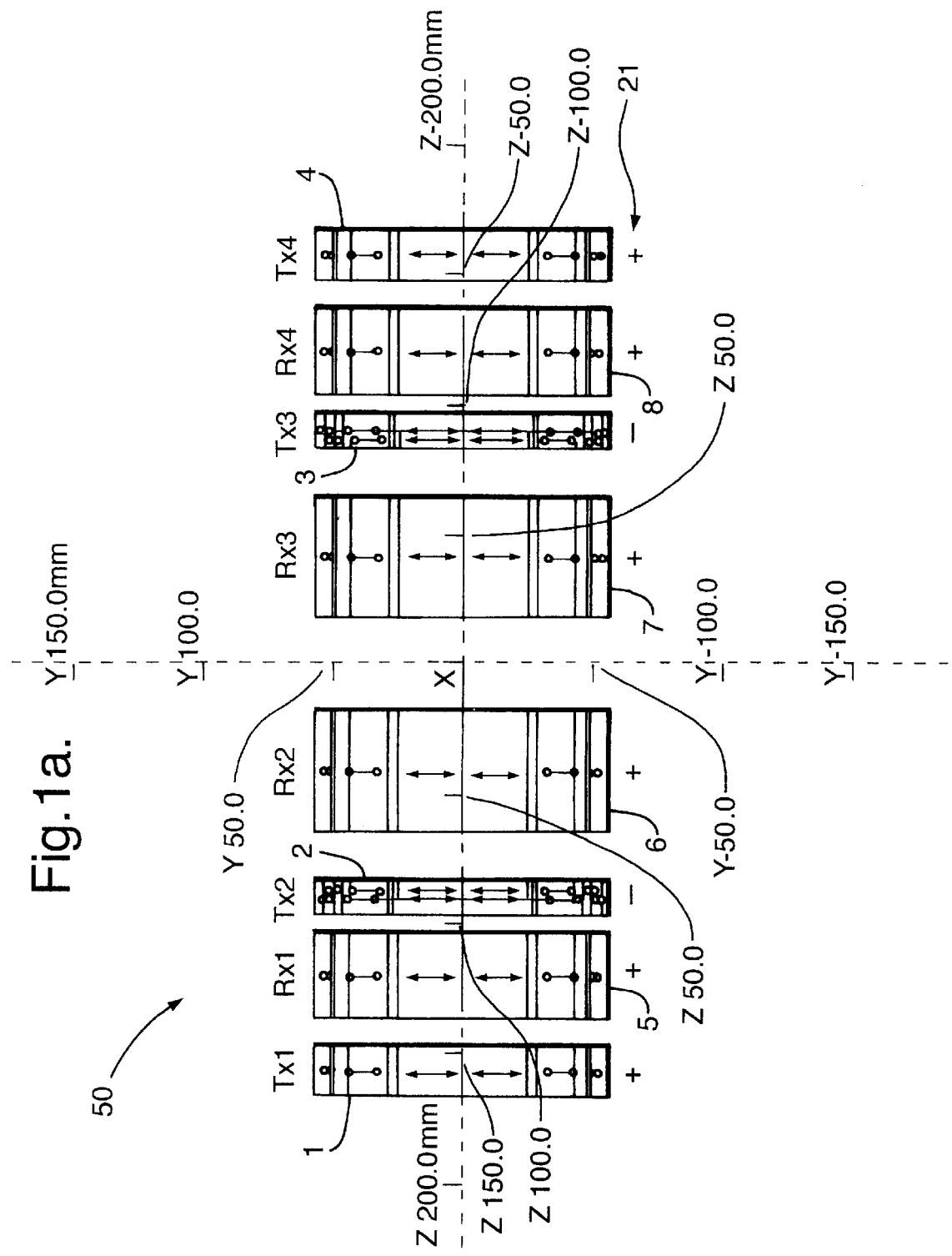
FIG. 1a is a side view of a transmitter/receiver coil arrangement according to the present invention.

FIG. 1 is a side view of a coil arrangement according to the present invention.

The coil assembly 50 (FIG. 1) comprises four transmitter coils 1–4, interleaved with four receiver coils 5–8. The assembly is designed for an axially optimised NMR BO assembly. The four transmitter coils 1–4 each comprise solenoidal windings which are serially connected as illustrated in FIG. 2. The receiver coils 5–8 also comprise solenoidal windings which are serially connected as indicated in FIG. 2. The winding elements 1–8 are coaxially wound on the same cylindrical former (not shown). The +/− signs indicated at 21 underneath the winding elements indicate their direction of winding. The winding elements 1,4,5–8 are wound in the positive direction, i.e. the elements are wound in an anti-clockwise direction when viewed along the Z-axis 20. Transmitter winding elements 2,3 are each sandwiched between a respective pair of Rx winding elements (5,6) and (7,8), and are wound in the negative direction (i.e. clockwise when viewed along the Z-axis).

As can be seen, the winding elements are divided into a first set (1,5,2,6) and a second set (7,3,8,4) which are symmetrical about the XY plane. Therefore they produce field profiles which are also symmetrical about the XY plane.

Figure 1B:
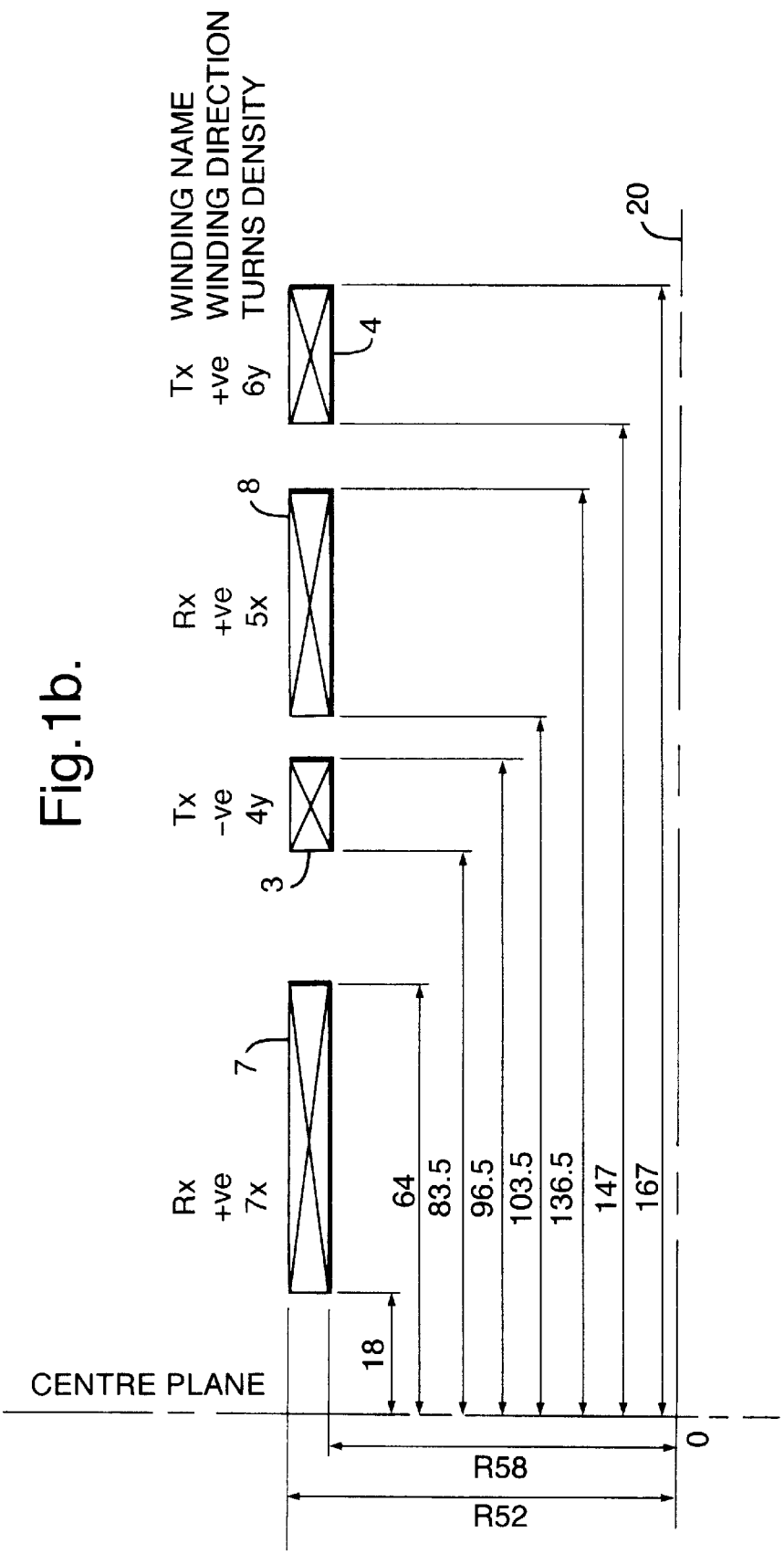

FIG. 1b is a cross-section in the plane X=0 showing the exact coil geometry of the righthand set of coils 3,4,7,8. The axial positions and inner and outer diameters of the coils are illustrated in FIG. 1b and tabulated below in Table 1.

TABLE 1

| Winding Element | Turns Density | Axial Inner Dimension (mm) | Axial Outer Dimension (mm) | Radial Inner Radius (mm) | Radial Outer Radius (mm) | Winding Direction |
|---|---|---|---|---|---|---|
| 7(Rx) | 7x | 18 | 64 | 52 | 58 | +ve |
| 3(Tx) | 4y | 83.5 | 96.5 | 52 | 58 | −ve |
| 8(Rx) | 5x | 103.5 | 136.5 | 52 | 58 | +ve |
| 4(Tx) | 6y | 147 | 167 | 52 | 58 | +ve |

The receiver coils 7,8 have a turns density of 7x and 5x respectively. The parameter x is determined by the receiver coil wire size. The transmitter coils 3,4 have a turns density of 4y and 6y respectively. The parameter y is determined by the transmitter coil wire size. The lefthand set of coils 1,2,5,6 (not shown) are identical to the righthand set illustrated in FIG. 1b.

A typical circuit configuration to tune the two coils independently to the same resonant frequency is shown in FIG. 2. Tx tank circuit 10 is tuned using variable capacitor 14. Rx tank circuit 9 is tuned using variable capacitor 15. The circuits 9,10 utilise the specific properties of the Tx amplifier 11 and Rx pre-amplifier (not shown) to which they are connected. An example of a suitable Tx amplifier is described in WO97/13159. In practice, even with minimal Tx-Rx coupling it is advantageous to fit crossed diodes 12,13 as shown to short out the Rx tank circuit 9 during the Tx pulse, thus taking it off resonance and reducing the energy coupled into it.

When the coil positions and relative number of turns in each element is correctly selected, there is almost zero coupling between Tx and Rx coils; i.e. the mutual inductance of the coils is very small (the coupling coefficient, K, is typically less than 0.01). Consequently very little energy is injected to the Rx L-C tank circuit 9 during the high power Tx pulse. This reduces the time taken to dissipate this energy and improves the NMR measurement dead-time, allowing the use of pulse sequences with short interecho time. In addition, the tuning of the Tx and Rx tank circuits 9,10 becomes independent when the coupling is minimised.

In practice it is necessary to trim the coil positions to minimise the coupling. This can be achieved by moving the outer Rx elements 5,8 axially by less than ±2 mm, after winding, by means of suitable packing pieces.

The axial component of the transmitter coil field profile is relatively uniform in the region of interest (in this case at a radius of 150 mm, from Z=−100 mm to 100 mm axially). FIG. 3 is a graph of the Z component of the Tx coil magnetic field in the sensitive region at a radius of 150 mm. As can be seen, with a typical working current density chosen for the Tx coil, the flux density varies by less than 0.5 gauss (25%) between the Z coordinates Z=0 and Z=80 mm (i.e. in the region indicated at 22).

The field strength produced by the Rx coil is a measure of its sensitivity in receiving signals emanating from a particular volume of space. By reciprocity, the field strength produced by a nominal current in the coil can be used to calculate the current induced by an NMR signal of given strength. Using this method the axial component of the receiver coil field profile is designed to be relatively uniform in the region of interest, hence giving uniform sensitivity in that region. FIG. 4 illustrates the axial component of the Rx coil magnetic field in the sensitive region at a radius of 150 mm. As can be seen, a flux density variation of less than 30% is exhibited between Z=0 and 80 mm.

The residual variations in the Tx and Rx field profiles in the region of interest are of roughly equal and opposite form, and thus tend to cancel, producing a uniform NMR response in that region.

Figure 5:
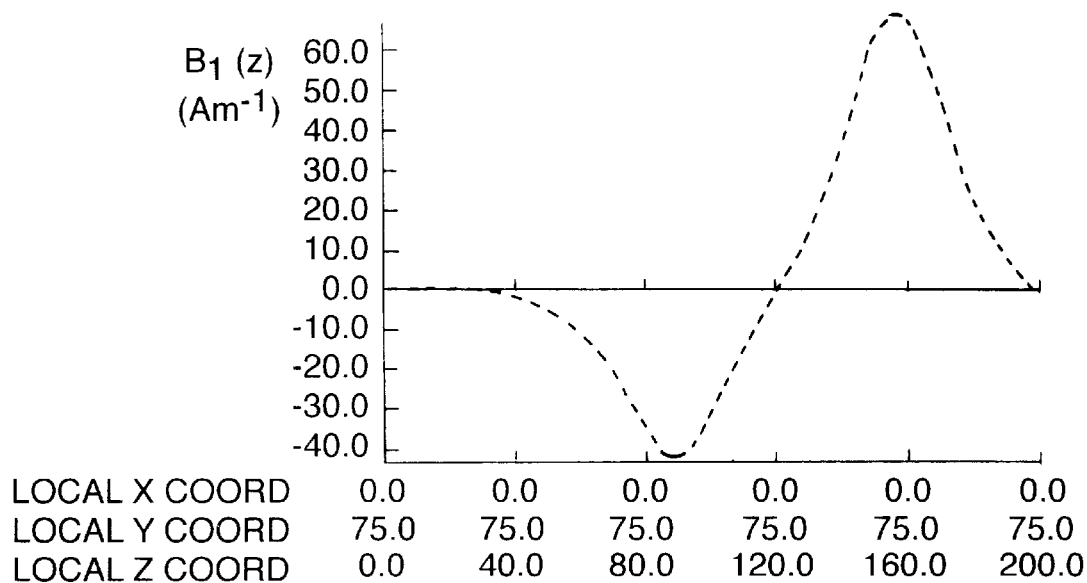
FIG. 5 is a graph showing the axial component of the transmitter coil magnetic field in the borehole at a radius of 75 mm.

The field profiles outside the region of interest also have the following useful properties:

The Tx coil B1 field displays strong gradients in the region of the B0 "borehole lobe" resonance (in this example, from 60 mm to 100 mm radially and ~50 mm to ~200 mm axially). FIG. 5 is a graph showing the axial component of the Tx coil B-field in the borehole at a radius of 75 mm. Strong gradients are demonstrated between Z=50 mm and Z=200 mm. These gradients cause rapid alternations in the phase of the NMR signal, which tend to cancel, thus eliminating the undesirable signal from the borehole region.

Figure 6:
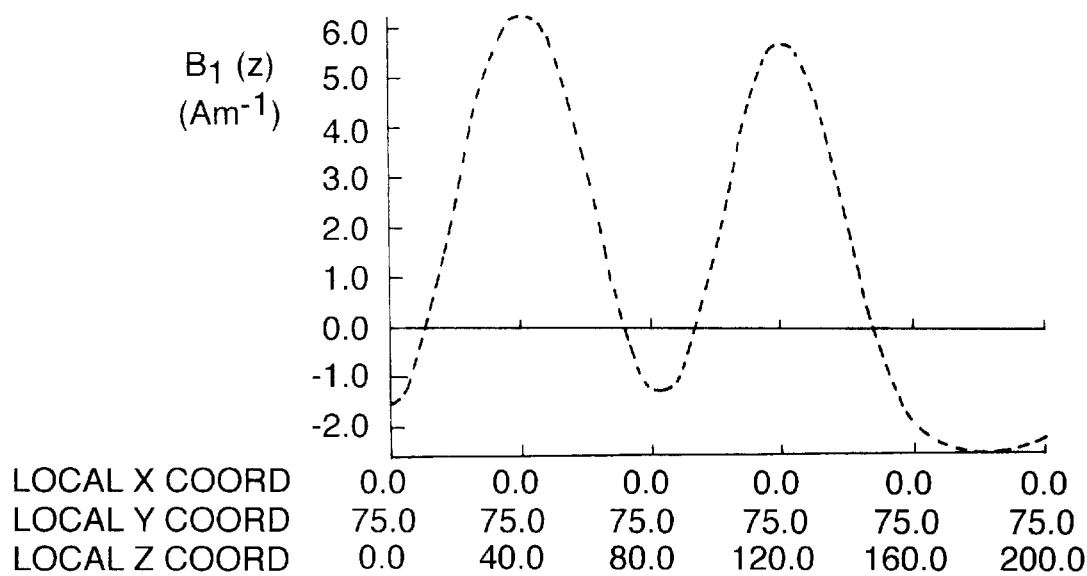
FIG. 6 is a graph illustrating the axial component of the receiver coil magnetic field in the borehole region at a radius of 75 mm.

The Rx coil displays a minimised field strength in the borehole lobe region, and hence, by reciprocity, a reduced sensitivity to signal from that region. FIG. 6 shows the axial component of the Rx coil B-field in the borehole region at a radius of 75 mm. As can be seen the B-field is minimised around Z=75 mm (which is in the region of the B0 borehole lobe).

The coupling can be minimised by suitably selecting the positions of the winding elements and the relative number of turns in each winding element. The exact coil geometry producing the required field profiles and minimal Tx-Rx coupling can be derived using the following iterative computational method:

(1) The field profiles are calculated using commercial software for predicting the magnetic field produced by an arbitrary array of current elements, using the numerical solution of the Biot-Savart equation. This calculation is exact for DC current (static magnetic field) but is also a very good approximation to the rf magnetic field if the displacement current term is negligible. This is true if the coil dimensions are small compared to the rf wavelength, which is the case for the geometry in question.

(2) The coil coupling is calculated by numerically integrating the magnetic flux linking the coils (the flux having been calculated using the method above).

(3) Coil elements are varied in axial position and turns density and trends in the field profile and coupling coefficient investigated until an optimum is achieved.

It should be noted that, within the same basic geometry, there exist alternative coil positions and turns ratios that produce equally good results—the exact coil geometry of FIG. 1 is not unique.

Figure 7:
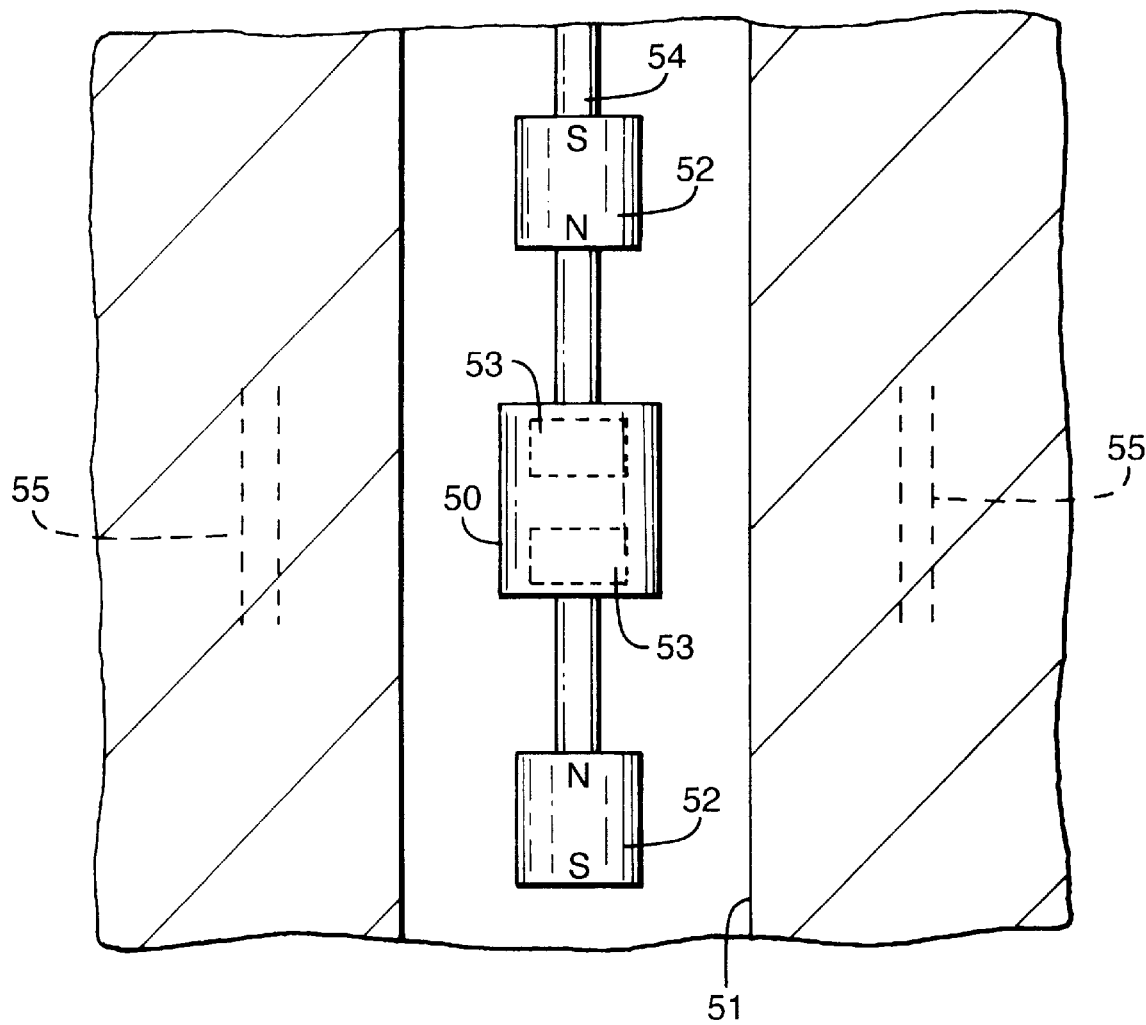
FIG. 7 is a diagram of the assembly inserted in a bore hole.

FIG. 7 is a diagram of a down hole well logging assembly in use incorporating an rf coil assembly 50 according to the present invention. The assembly is inserted in a bore hole 51. Pairs of B0 field generating magnets 52,53 are mounted on a suitable support 54 and are axially adjustable relative to one another so as to enable the size and location of the working region 55 to be determined. The orientation of the shim magnets 53 are determined as required in order to achieve the desired working region as will the strength of the magnets. The rf coil assembly 50 is positioned coaxially with the central axis of the support 54. The shim magnets 53 (indicated in dotted lines) are totally inside the rf coil assembly 50.

In use, the support 54 is coupled to a mechanism (not shown) which drops the assembly down through the bore hole 51. The working region 55 is formed in the rock around the bore hole 51 so that information can be obtained from that region.

The outer pair of magnets 52 are arranged coaxially with like poles facing each other and axially spaced apart. The inner pair of magnets 53 are coaxial with the magnets 52. The magnets 52,53 are arranged such that the static B0 magnetic field within the working region 55 is radially oriented and exhibits a radial gradient and is substantially uniform in the axial direction.

The B0 generating assembly of FIG. 7 is described in more detail in EP-A-0774671.

A further alternative assembly according to the present invention is illustrated schematically in FIG. 8. FIG. 8 is a side view of the coil assembly.

The transmit coil comprises two serially connected winding elements 60,61 which are sandwiched between two serially connected receiver coil winding elements 62,63. The coils 60–63 are concentric, co-axial and co-planar circular hoops. The winding elements 61,62 and 63 are wound in the positive direction whereas the inner transmitter winding element 60 is wound in the negative direction. The ratio of the number of turns of each of the receiver winding elements 62,63 to the number of turns of each of the transmitter winding elements 60,61 is 2:1. For example, each of the receiver winding elements 62,63 may have two turns and each of the transmitter winding elements 60,61 may have one turn.

The B0 field in the working region 71 is external to the generating solenoid 70 and substantially uniform and oriented in the plane of the RF coils, along the axis of the generating solenoid 70 (perpendicular to the page in FIG. 8). In this system, the working region is defined as that portion of the sample, which is already uniformly polarised at the Lamor frequency of interest, that is subject to a uniform spin tip during the RF pulse. The B0 homogenous region is a toroid around the magnet solenoid, but only an arc of the toroid is excited by the RF coils (see FIG. 8).

The B0 generating solenoid 70, generates a B0 homogeneous region 74 inside circles 72,73. The working region 71 defined by the B1 field, is an ellipse.

The B1 transmitter and receiver RF fields in the working region are substantially uniform, thanks to the designed coil geometry, and are substantially radially oriented with respect to the B0 magnet. In the working region, B1 transmit and receive fields are substantially orthogonal to the B0 field and are relatively uniform, so that conditions for NMR are therefore optimised in the working region. Outside the working region, the B1 transmit and receive RF fields are not uniform, and undesirable NMR signal is therefore attenuated by the mechanisms previously described for the solenoidal coil geometry. This is all achieved at the same time as minimum transmitter to receiver coupling.

I claim:

1. An rf coil assembly for use in an NMR investigation, said assembly comprising:
   (1) a transmitter coil adapted to transmit an rf magnetic field suitable for the NMR investigation into a working region and comprising a plurality of serially connected winding elements; and
   (2) a receiver coil electrically separate from said transmitter coil and adapted to receive an rf signal from said working region and comprising a plurality of serially connected winding elements,
   wherein winding elements of one coil are interleaved and substantially coaxial with winding elements of the other coil, and wherein one of said coils comprises one or more winding elements which are counter-wound with respect to at least one of the winding elements of said other coil.

2. An assembly according to claim 1 wherein each of said receiver coil winding elements are arranged substantially coaxially with each of said transmitter coil winding elements.

3. An assembly according to claim 1 wherein said winding elements each comprise one or more solenoidal turns of an electrical conductor.

4. An assembly according to claim 1 wherein said coils are arranged such that the field profiles associated with said transmitter and receiver coils are suitable for obtaining NMR information from material in a working region which is defined by a static magnetic B0 profile.

5. An assembly according to claim 4 wherein said static magnetic B0 field profile is radially outwardly spaced from said coils and extends substantially parallel with an axis defined by said coils; and wherein both coils exhibit substantially axially oriented, and substantially uniform rf magnetic flux in said axial direction over said working region.

6. An assembly according to claim 1, wherein said winding elements of one coil are substantially co-planar and concentric with winding elements of the other coil.

7. An assembly according to claim 1 wherein at least two of the winding elements of one coil are each sandwiched between a respective pair of winding elements of the other coil.

8. An assembly according to claim 1, wherein said working region is outside said coils.

9. An rf coil assembly according to claim 1 wherein the coupling coefficient between said two coils is less than 0.01.

10. An assembly according to claim 1 wherein said at least one coil comprises said transmitter coil.

11. The assembly of claim 1 wherein a winding element of said one coil is wound clockwise and a winding element of said other coil is wound counterclockwise.

12. NMR investigation apparatus comprising an rf coil assembly; and a magnet assembly adapted to generate a permanent magnetic field within a working region being suitable for obtaining NMR information from material in said working region, wherein said rf coil assembly comprises:
   (1) a transmitter coil adapted to transmit an rf magnetic field suitable for the NMR investigation into a working region and comprising a plurality of serially connected winding elements; and
   (2) a receiver coil electrically separate from said transmitter coil and adapted to receive an rf signal from said working region and comprising a plurality of serially connected winding elements,
   wherein winding elements of one coil are interleaved and substantially coaxial with winding elements of the other coil, and wherein one of said coils comprises one or more winding elements which are counter-wound with respect to at least one of the winding elements of said other coil.

13. Apparatus according to claim 12, wherein said permanent magnetic field has a radial gradient and is substantially uniform in the axial direction.

14. Apparatus according to claim 13, wherein said magnet assembly comprises one or more permanent magnets mounted coaxially with said rf coil assembly.

15. Down-hole well logging or measurement whilst drilling (MWD) apparatus comprising NMR investigation apparatus according to claim 11.

16. The assembly of claim 11 wherein a winding element of said one coil is wound clockwise and a winding element of said other coil is wound counterclockwise.

17. An rf coil assembly for use in an NMR investigation, said assembly comprising:
   (1) a transmitter coil adapted to transmit an rf magnetic field suitable for the NMR investigation into a working region and comprising a plurality of serially connected winding elements; and
   (2) a receiver coil electrically separate from said transmitter coil and adapted to receive an rf signal from said working region and comprising a plurality of serially connected winding elements;
   wherein a winding element of one coil is sandwiched between and substantially coaxial with a pair of winding elements of the other coil, and wherein one of said coils comprises at least one winding element which is wound in a direction opposite to the direction in which at least one of the winding elements of said other coil is wound.

* * * * *